United States Patent
Nakanishi

(10) Patent No.: US 10,644,480 B2
(45) Date of Patent: May 5, 2020

(54) OPTICAL MODULE

(71) Applicant: Sumitomo Electric Industries, Ltd., Osaka-shi (JP)

(72) Inventor: Hiromi Nakanishi, Itami (JP)

(73) Assignee: Sumitomo Electric Industries, Ltd., Osaka-shi, (JP)

( * ) Notice: Subject to any disclaimer, the term of this patent is extended or adjusted under 35 U.S.C. 154(b) by 0 days.

(21) Appl. No.: 16/094,016

(22) PCT Filed: Apr. 19, 2017

(86) PCT No.: PCT/JP2017/015771
§ 371 (c)(1),
(2) Date: Oct. 16, 2018

(87) PCT Pub. No.: WO2017/188097
PCT Pub. Date: Nov. 2, 2017

(65) Prior Publication Data
US 2019/0131763 A1    May 2, 2019

(30) Foreign Application Priority Data

Apr. 25, 2016 (JP) ................ 2016-086721

(51) Int. Cl.
*H01S 5/022* (2006.01)
*H01S 5/40* (2006.01)
(Continued)

(52) U.S. Cl.
CPC ...... *H01S 5/02248* (2013.01); *H01S 5/02292* (2013.01); *H01S 5/4012* (2013.01);
(Continued)

(58) Field of Classification Search
CPC .. H01S 5/02248; H01S 5/4093; H01S 5/4012; H01S 5/40; H01S 5/022; H05K 13/0465; H05K 3/303
See application file for complete search history.

(56) References Cited

U.S. PATENT DOCUMENTS 5,542,018 A * 7/1996 Kuhara ............... G02B 6/4204
257/184
2009/0103923 A1* 4/2009 Hosomi ............... G02B 6/4215
398/91
(Continued)

FOREIGN PATENT DOCUMENTS

JP  2007-017925 A  1/2007
JP  2007-065600 A  3/2007
(Continued)

*Primary Examiner* — Yuanda Zhang
(74) *Attorney, Agent, or Firm* — Baker Botts, L.L.P.; Michael A. Sartori

(57) ABSTRACT

An optical module includes a light-forming part configured to form light; and a protective member that includes an output window configured to transmit light from the light-forming part and that is disposed so as to surround the light-forming part. The light-forming part includes a base member; a plurality of semiconductor light-emitting devices mounted on the base member and configured to emit light differing from each other in wavelength; and a filter mounted on the base member and configured to directly receive and coaxially multiplex diverging light from the plurality of semiconductor light-emitting devices.

17 Claims, 6 Drawing Sheets

(51) Int. Cl.
*H05K 3/30* (2006.01)
*H05K 13/04* (2006.01)

(52) U.S. Cl.
CPC ........... *H01S 5/4093* (2013.01); *H05K 3/303* (2013.01); *H05K 13/0465* (2013.01); *H01S 5/02212* (2013.01); *H01S 5/02284* (2013.01); *H01S 5/02288* (2013.01)

(56) References Cited

U.S. PATENT DOCUMENTS

| | | | | |
|---|---|---|---|---|
| 2010/0278482 | A1* | 11/2010 | Adachi | G02B 6/4204 |
| | | | | 385/33 |
| 2014/0240952 | A1* | 8/2014 | Nakanishi | G02B 27/30 |
| | | | | 362/19 |
| 2015/0048147 | A1* | 2/2015 | Ide | H01S 5/02248 |
| | | | | 228/175 |
| 2015/0241636 | A1* | 8/2015 | Ohata | G02B 6/4267 |
| | | | | 359/820 |
| 2017/0322381 | A1* | 11/2017 | Saeki | G02B 6/32 |

FOREIGN PATENT DOCUMENTS

| | | |
|---|---|---|
| JP | 2007-328895 A | 12/2007 |
| JP | 2009-093101 A | 4/2009 |
| JP | 2016-004850 A | 1/2016 |
| WO | 2013/146313 A1 | 10/2013 |
| WO | 2015/005329 A1 | 1/2015 |

\* cited by examiner

OPTICAL MODULE

TECHNICAL FIELD

The present invention relates to an optical module.

This application claims priority based on Japanese Patent Application No. 2016-086721 filed in the Japan Patent Office on Apr. 25, 2016 and the entire contents of this Japanese Patent Application are incorporated herein by reference.

BACKGROUND ART

There are known optical modules that include semiconductor light-emitting devices within packages (for example, refer to Japanese Unexamined Patent Application Publication No. 2009-93101 (Patent Literature 1), Japanese Unexamined Patent Application Publication No. 2007-328895 (Patent Literature 2), Japanese Unexamined Patent Application Publication No. 2007-17925 (Patent Literature 3), and Japanese Unexamined Patent Application Publication No. 2007-65600 (Patent Literature 4)).

CITATION LIST

Patent Literature

PTL 1: Japanese Unexamined Patent Application Publication No. 2009-93101
PTL 2: Japanese Unexamined Patent Application Publication No. 2007-328895
PTL 3: Japanese Unexamined Patent Application Publication No. 2007-17925
PTL 4: Japanese Unexamined Patent Application Publication No. 2007-65600

SUMMARY OF INVENTION

An optical module according to the present invention includes a light-forming part configured to form light; and a protective member that includes an output window configured to transmit light from the light-forming part and that is disposed so as to surround the light-forming part. The light-forming part includes a base member; a plurality of semiconductor light-emitting devices mounted on the base member and configured to emit light differing from each other in wavelength; and a filter mounted on the base member and configured to directly receive and coaxially multiplex diverging light from the plurality of semiconductor light-emitting devices.

DESCRIPTION OF EMBODIMENTS

Technical Problem

Figure 1:
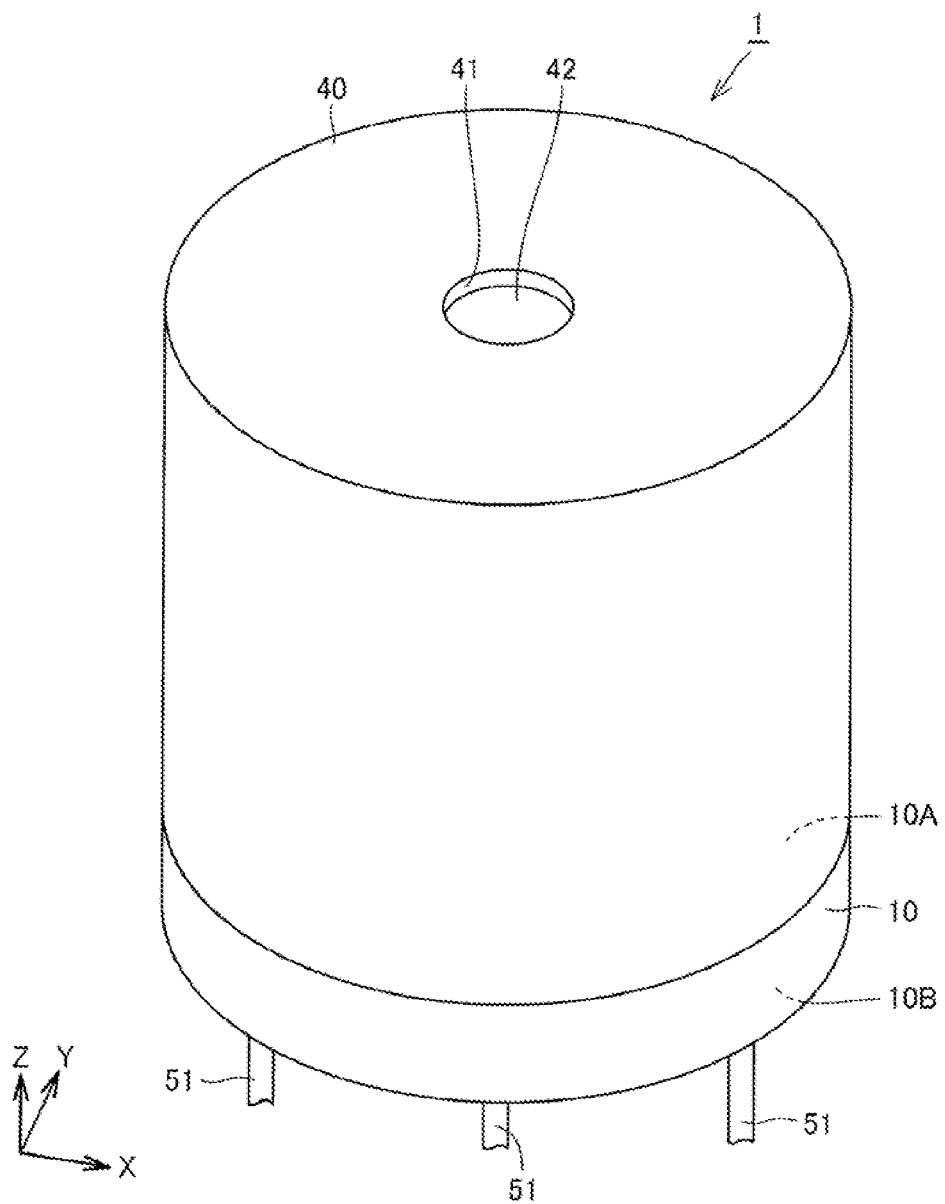
FIG. 1 is a schematic perspective view illustrating the structure of an optical module according to Embodiment 1.

In order to further increase the use of optical modules and increase the range of applications of optical modules, a reduction in the size of optical modules is important. There has been a demand for an optical module configured to multiplex light differing from each other in wavelength and emit the multiplexed light, to thereby emit, for example, light of plural colors from the single optical module. However, employment of such a structure configured to multiplex light differing from each other in wavelength and emit the multiplexed light hampers a reduction in the size of the optical module, which is problematic.

Accordingly, it is an object to provide an optical module having a reduced size and configured to multiplex light differing from each other in wavelength and emit the multiplexed light.

Advantageous Effects of Disclosure

The optical module according to the present disclosure provides an optical module having a reduced size and configured to multiplex light differing from each other in wavelength and emit the multiplexed light.

DESCRIPTION OF EMBODIMENTS OF THE PRESENT INVENTION

Embodiments according to the present invention will be first listed and described. An optical module according to the present application includes a light-forming part configured to form light; and a protective member that includes an output window configured to transmit light from the light-forming part and that is disposed so as to surround the light-forming part. The light-forming part includes a base member; a plurality of semiconductor light-emitting devices mounted on the base member and configured to emit light differing from each other in wavelength; and a filter mounted on the base member and configured to directly receive and coaxially multiplex diverging light from the plurality of semiconductor light-emitting devices.

In the optical module according to the present application, light differing from each other in wavelength and emitted from the plural semiconductor light-emitting devices is coaxially multiplexed at the filter. Thus, light differing from each other in wavelength can be multiplexed and emitted from the optical module. The filter is configured to multiplex diverging light from the semiconductor light-emitting devices. In other words, at the filter, light from the plural semiconductor light-emitting devices is coaxially multiplexed without being converted by any lens into collimated light. Thus, there is no need to dispose lenses between the filter and the semiconductor light-emitting devices. This enables a reduction in the size. In summary, the optical module according to the present application provides an optical module having a reduced size and configured to multiplex light differing from each other in wavelength and emit the multiplexed light. Incidentally, examples of the filter include wavelength selective filters and polarization synthesizing filters.

In the above-described optical module, the diverging light emitted from the semiconductor devices may be, without passing through any lens, transmitted by the filter or reflected by the filter. The above-described optical module may employ such a configuration.

The above-described optical module may further include a lens disposed at the output window and configured to convert, in terms of spot size, coaxially multiplexed diverging light from the plurality of semiconductor light-emitting devices. In this case, while a compact shape is maintained, light of a desired spot size can be obtained.

In the above-described optical module, the lens disposed at the output window may be a spherical lens. Such a spherical lens is suitable as the lens disposed at the output window.

The above-described optical module may further include a support member disposed on the protective member and for supporting an optical component that light outputted through the output window enters. This facilitates attachment of an optical component such as a lens or an optical fiber waveguide while a compact shape is maintained.

The above-described optical module may further include the optical component supported by the support member. The optical component may be an optical fiber waveguide. Alternatively, the optical component may be a lens. The above-described optical module may employ such a configuration.

In the above-described optical module, the plurality of semiconductor light-emitting devices may include a semiconductor light-emitting device configured to emit red light, a semiconductor light-emitting device configured to emit green light, and a semiconductor light-emitting device configured to emit blue light. This enables multiplexing of such light to form light of a desired color.

In the above-described optical module, the semiconductor light-emitting devices may be laser diodes. This enables emission of light having less variation in wavelength.

Details of Embodiments of the Present Invention

Hereinafter, optical modules according to embodiments of the present invention will be described with reference to drawings. In the drawings below, like or corresponding elements are denoted by like reference numerals and descriptions thereof will not be repeated.

Embodiment 1

Figure 2:
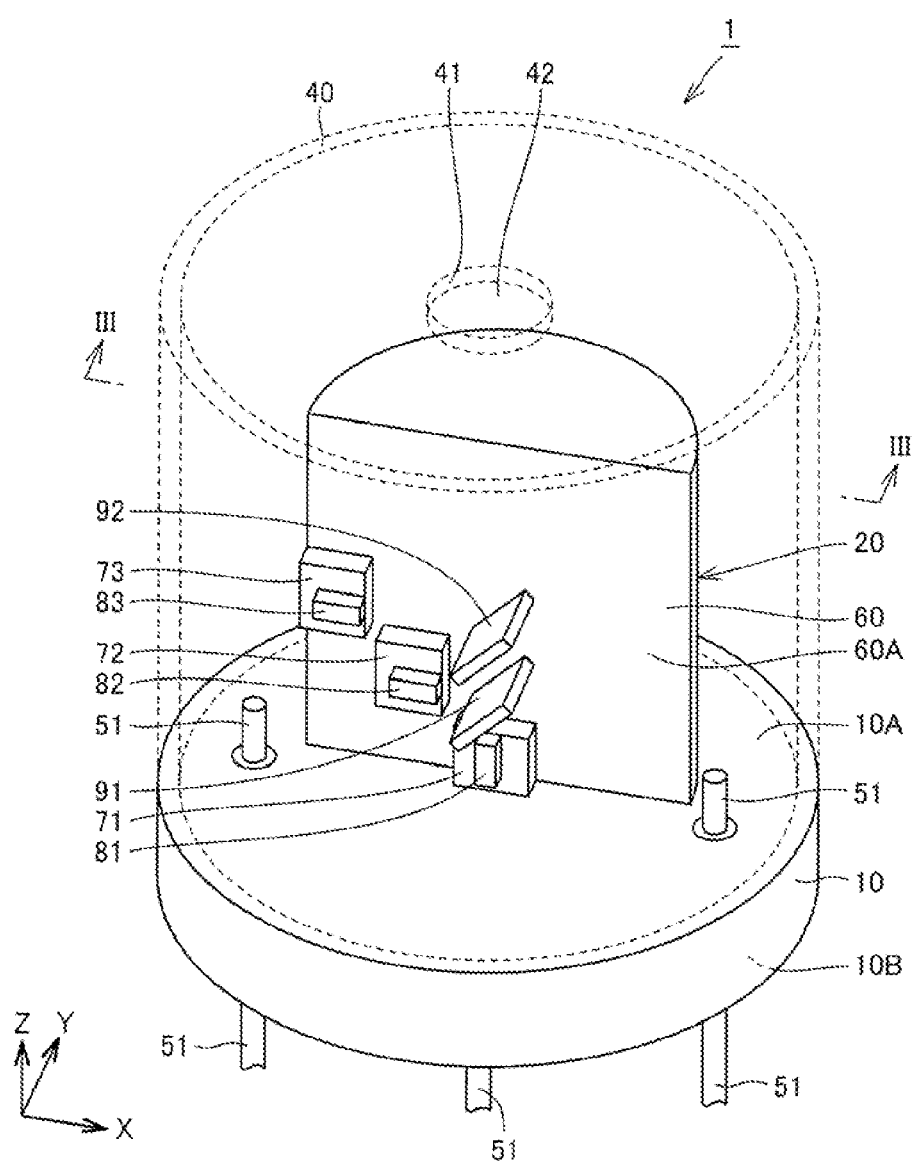
FIG. 2 is a schematic perspective view illustrating the structure of an optical module according to Embodiment 1.
Figure 3:
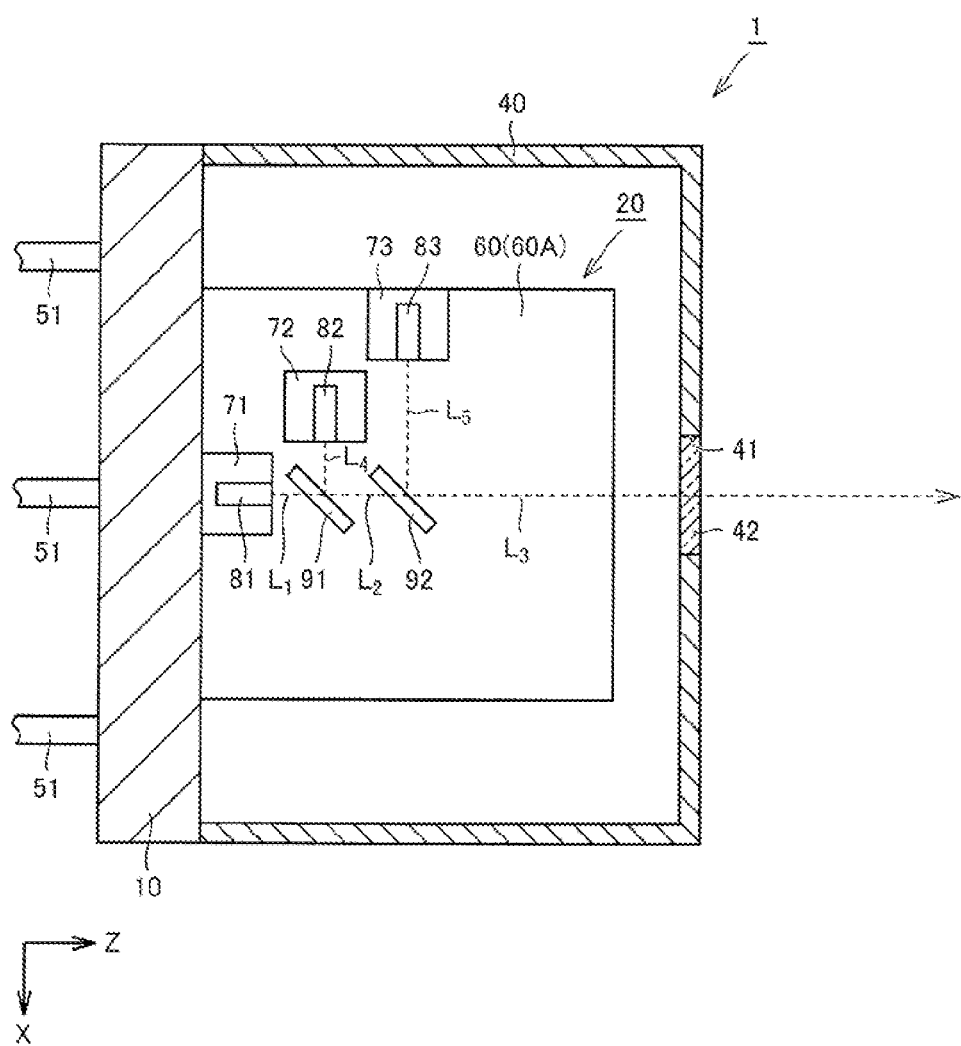
FIG. 3 is a schematic sectional view illustrating the structure of an optical module according to Embodiment 1.

Referring to FIG. 1 to FIG. 3, Embodiment 1 will be first described. FIG. 2 corresponds to a state in which a cap 40 in FIG. 1 is detached. FIG. 3 is a sectional view taken along line in FIG. 2.

Referring to FIG. 1 and FIG. 2, an optical module 1 according to this embodiment includes a stem 10 having the shape of a disc; a light-forming part 20 disposed on one main surface 10A of the stem 10 and configured to form light; a cap 40 disposed on and in contact with the one main surface 10A of the stem 10 so as to cover the light-forming part 20; and plural lead pins 51 protruding from both of the one main surface 10A and the other main surface 10B. The stem 10 and the cap 40 are, for example, welded together by a method such as YAG (Yittrium Aluminium Garnet) laser welding or resistance welding, to provide a hermetically sealed state. In other words, the light-forming part 20 is hermetically sealed by the stem 10 and the cap 40.

The space surrounded by the stem 10 and the cap 40 contains, for example, a gas having a reduced water content (moisture is removed), such as dry air or dry nitrogen. The cap 40 has an output window 41, which is formed as a through-hole configured to transmit light from the light-forming part 20. At the output window 41, a transmitting plate 42 is disposed. The transmitting plate 42 has the shape of a flat plate (the shape of a disc) whose main surfaces are parallel to each other and is configured to transmit light formed in the light-forming part 20. The transmitting plate 42 is formed of glass, for example. The stem 10 and the cap 40 constitute a protective member.

Referring to FIG. 2, the light-forming part 20 includes a base block 60, which is a base member having the shape of a semicircular column. The base block 60 has a mount surface 60A having a rectangular shape. The base block 60 is fixed, at its semicircular bottom surface, on the one main surface 10A of the stem 10. The mount surface 60A is disposed so as to intersect, more specifically, be perpendicular to the one main surface 10A of the stem 10. The one main surface 10A and the other main surface 10B of the stem 10 extend along the X-Y plane. The mount surface 60A extends along the X-Z plane.

Referring to FIG. 2 and FIG. 3, on the mount surface 60A, a first submount 71 having the shape of a flat plate is disposed. On the first submount 71, a first laser diode 81 is disposed. The first laser diode 81 emits red light. The first submount 71 and the first laser diode 81 are disposed such that light from the first laser diode 81 is emitted along one side of the mount surface 60A.

On the mount surface 60A, a second submount 72 having the shape of a flat plate is disposed. On the second submount 72, a second laser diode 82 is disposed. The second laser diode 82 emits green light. The second submount 72 and the second laser diode 82 are disposed such that light from the second laser diode 82 is emitted along another side (that intersects the above-described one side) of the mount surface 60A. The second submount 72 and the second laser diode 82 are disposed such that light from the second laser diode 82 is emitted in a direction so as to intersect (be orthogonal to) light from the first laser diode 81.

On the mount surface 60A, a third submount 73 having the shape of a flat plate is disposed. On the third submount 73, a third laser diode 83 is disposed. The third laser diode 83 emits blue light. The third submount 73 and the third laser diode 83 are disposed such that light from the third laser diode 83 is emitted along the above-described other side of the mount surface 60A. The third submount 73 and the third laser diode 83 are disposed such that light from the third laser diode 83 is emitted in a direction so as to intersect (be orthogonal to) light from the first laser diode 81. The third submount 73 and the third laser diode 83 are disposed such that light from the third laser diode 83 is emitted in a direction along light from the second laser diode 82 (parallel to light from the second laser diode 82).

The heights of the optical axes of the first laser diode 81, the second laser diode 82, and the third laser diode 83 (distances between each optical axis and a reference surface that is the mount surface 60A: distances from the reference surface in the Y-axis direction) are adjusted to be the same by the first submount 71, the second submount 72, and the third submount 73. The first laser diode 81 emits light in the Z direction. The second laser diode 82 and the third laser diode 83 emit light in the X direction. The emission direction of light from the first laser diode 81 intersects the emission directions of light from the second laser diode 82 and the third laser diode 83. More specifically, the emission direction of light from the first laser diode 81 is orthogonal to the emission directions of light from the second laser diode 82 and the third laser diode 83. The main surface of the third submount 73 on which the third laser diode 83 is mounted, the main surface of the second submount 72 on which the second laser diode 82 is mounted, and the main surface of the first submount 71 on which the first laser diode 81 is mounted are parallel to each other.

A first filter 91 is disposed in a region on the mount surface 60A, the region corresponding to the position where light emitted from the first laser diode 81 intersects light emitted from the second laser diode 82. A second filter 92 is disposed in a region on the mount surface 60A, the region corresponding to the position where light emitted from the first laser diode 81 intersects light emitted from the third laser diode 83. The first filter 91 and the second filter 92 each have the shape of a flat plate whose main surfaces are parallel to each other. The first filter 91 and the second filter 92 are, for example, wavelength selective filters. The first filter 91 and the second filter 92 are dielectric multilayer film filters.

The first filter 91 transmits red light, but reflects green light. The second filter 92 transmits red light and green light, but reflects blue light. Thus, the first filter 91 and the second filter 92 selectively transmit and reflect light of specific wavelengths. As a result, the first filter 91 and the second filter 92 multiplex light emitted from the first laser diode 81, the second laser diode 82, and the third laser diode 83.

The main surfaces of the first filter 91 and the second filter 92 incline with respect to the Z direction and the X direction. More specifically, the main surfaces of the first filter 91 and the second filter 92 incline at 45° with respect to the Z direction (the emission direction of the first laser diode 81) and with respect to the X direction (the emission directions of the second laser diode 82 and the third laser diode 83).

Light emitted from the first laser diode 81 reaches the first filter 91 and the second filter 92 without passing through any lens. Light emitted from the second laser diode 82 reaches the first filter 91 and the second filter 92 without passing through any lens. Light emitted from the third laser diode 83 reaches the second filter 92 without passing through any lens. In other words, no lens is disposed between the first laser diode 81 and the first filter 91. No lens is disposed between the second laser diode 82 and the first filter 91. No lens is disposed between the third laser diode 83 and the second filter 92. Light from the first laser diode 81, the second laser diode 82, and the third laser diode 83 reaches the output window 41 without passing through any lens.

Hereinafter, operations of the optical module 1 according to this embodiment will be described. Referring to FIG. 3, red light emitted from the first laser diode 81 travels along an optical path $L_1$, and enters the first filter 91. The first filter 91 transmits red light, so that the light emitted from the first laser diode 81 further travels along an optical path $L_2$, and enters the second filter 92. The second filter 92 transmits red light, so that the light emitted from the first laser diode 81 further travels along an optical path $L_3$, and is outputted through the transmitting plate 42 disposed at the output window 41 of the cap 40 to the outside of the optical module 1.

Green light emitted from the second laser diode 82 travels along an optical path $L_4$, and enters the first filter 91. The first filter 91 reflects green light, so that the light emitted from the second laser diode 82 joins the optical path $L_2$. As a result, the green light is coaxially multiplexed with the red light, travels along the optical path $L_2$, and enters the second filter 92. The second filter 92 transmits green light, so that the light emitted from the second laser diode 82 further travels along the optical path $L_3$, and is outputted through the transmitting plate 42 disposed at the output window 41 of the cap 40 to the outside of the optical module 1.

Blue light emitted from the third laser diode 83 travels along an optical path $L_5$, and enters the second filter 92. The second filter 92 reflects blue light, so that the light emitted from the third laser diode 83 joins the optical path $L_3$. As a result, the blue light is multiplexed with the red light and the green light, travels along the optical path $L_3$, and is outputted through the transmitting plate 42 disposed at the output window 41 of the cap 40 to the outside of the optical module 1.

In this way, light formed by multiplexing red light, green light, and blue light is outputted through the output window 41 of the cap 40. The light emitted from the first laser diode 81, the second laser diode 82, and the third laser diode 83 is diverging light. The first filter 91 and the second filter 92 coaxially multiplex such light having reached the first filter 91 and the second filter 92 without passing through any lens. In other words, the first filter 91 and the second filter 92 directly receive and coaxially multiplex diverging light from the first laser diode 81, the second laser diode 82, and the third laser diode 83.

The positions and orientations of the first filter 91 and the second filter 92 can be adjusted in the following manner, for example. Referring to FIG. 3, the first submount 71, the second submount 72, the third submount 73, the first laser diode 81, the second laser diode 82, and the third laser diode 83 are first fixed on the mount surface 60A of the base block 60, and electrical connections are formed. Subsequently, on regions in the mount surface 60A for mounting the first filter 91 and the second filter 92, for example, an adhesive composed of an ultraviolet curing resin is used to support the first filter 91 and the second filter 92. At this time, the adhesive provides adhesion of supporting the first filter 91 and the second filter 92, but these filters are not completely fixed yet.

Subsequently, while a reference lens is disposed on a side of the base block 60, the side being opposite to the other side where the stem 10 is disposed, the first laser diode 81 is electrified to emit light. This light (diverging ray) from the first laser diode 81 is converted by the reference lens into collimated light. The collimated light is received with, for example, a CCD (charge coupled device) camera; and the position of the light received is defined as a reference point.

Subsequently, electrification of the first laser diode 81 is stopped, and the second laser diode 82 is electrified to emit light. The light from the second laser diode 82 is converted by the reference lens into collimated light, and then received by the CCD camera. The first filter 91 is adjusted such that the light from the second laser diode 82 matches the reference point.

Subsequently, electrification of the second laser diode 82 is stopped, and the third laser diode 83 is electrified to emit light. The light from the third laser diode 83 is converted by the reference lens into collimated light, and then received by the CCD camera. The second filter 92 is adjusted such that the light from the third laser diode 83 matches the reference point. After that, the adhesive that is an ultraviolet curing resin is cured by being irradiated with ultraviolet rays, to thereby fix the first filter 91 and the second filter 92. In this way, the positions and orientations of the first filter 91 and the second filter 92 are adjusted such that diverging light from the first laser diode 81, the second laser diode 82, and the third laser diode 83 are coaxially multiplexed. After that, the cap 40 is attached to the stem 10.

In the optical module 1 according to this embodiment, the first laser diode 81, the second laser diode 82, and the third laser diode 83 emit light differing from each other in wavelength and the light is coaxially multiplexed at the first filter 91 and the second filter 92. Thus, light differing from each other in wavelength is multiplexed to thereby emit light of a desired color from the optical module 1. At the first filter 91 and the second filter 92, diverging light from the first laser diode 81, the second laser diode 82, and the third laser diode 83 are multiplexed. In other words, at the first filter 91 and the second filter 92, light from the first laser diode 81, the second laser diode 82, and the third laser diode 83 are coaxially multiplexed without being converted by lenses into collimated light. Thus, no lens needs to be disposed between the first laser diode 81, the second laser diode 82, and the third laser diode 83, and the first filter 91 and the second filter 92. This enables a reduction in the size. Therefore, the optical module 1 according to this embodiment is an optical module having a reduced size and configured to multiplex light differing from each other in wavelength and emit the multiplexed light.

Embodiment 2

Figure 4:
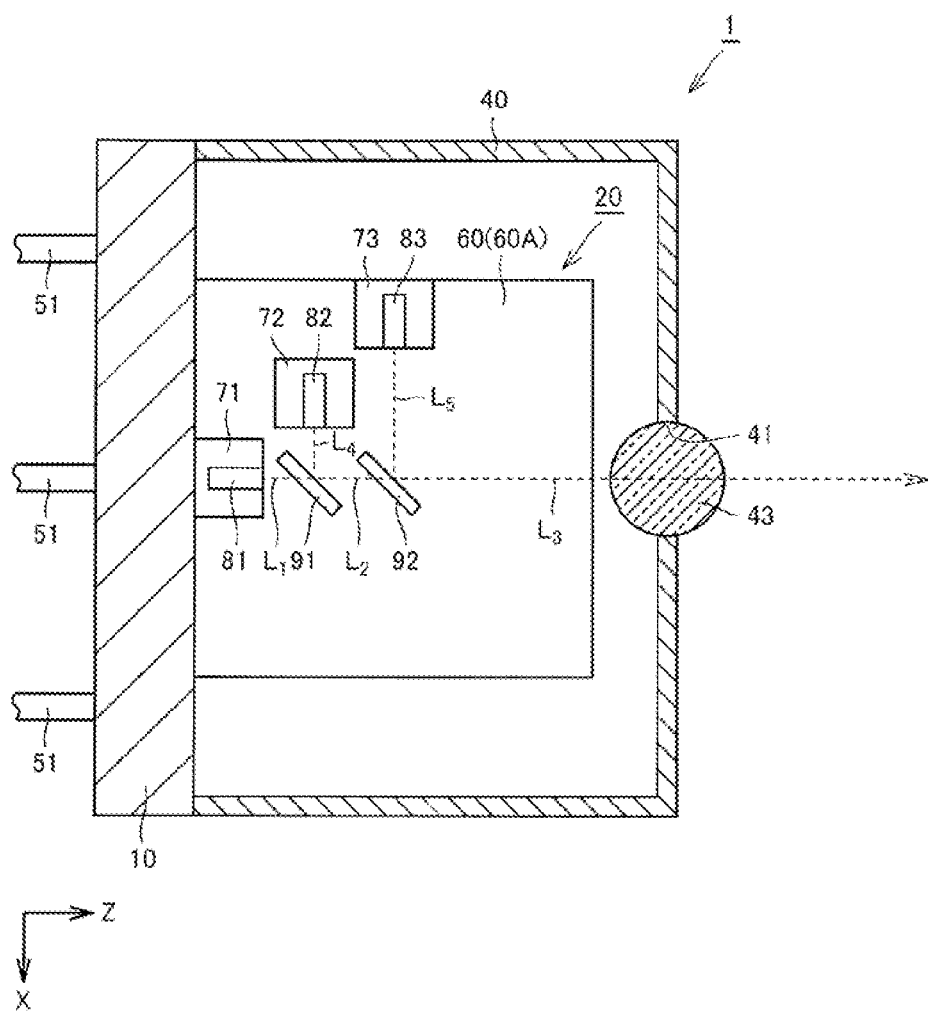
FIG. 4 is a schematic sectional view illustrating the structure of an optical module according to Embodiment 2.

Hereinafter, another embodiment, Embodiment 2 will be described. FIG. 4 is a schematic sectional view illustrating the structure of an optical module according to Embodiment 2. FIG. 4 is a sectional view corresponding to FIG. 3 of Embodiment 1 described above. Referring to FIG. 4 and FIG. 3, an optical module 1 according to this embodiment basically has the same structure and provides the same advantages as in Embodiment 1. However, the optical module 1 according to Embodiment 2 is different from Embodiment 1 in that a lens is disposed at the output window 41.

Referring to FIG. 4, in the optical module 1 according to Embodiment 2, a spherical lens 43 that is a collimating lens is disposed at the output window 41. As a result, diverging light emitted from the first laser diode 81, the second laser diode 82, and the third laser diode 83 and coaxially multiplexed at the first filter 91 and the second filter 92, are converted by the spherical lens 43 into collimated light and outputted from the optical module 1. Such a structure is employed, so that collimated light is emitted from the optical module 1 while a reduction in the size of the optical module 1 is achieved, compared with a case of disposing lenses on the mount surface 60A so as to individually correspond to the first laser diode 81, the second laser diode 82, and the third laser diode 83.

Embodiment 3

Figure 5:
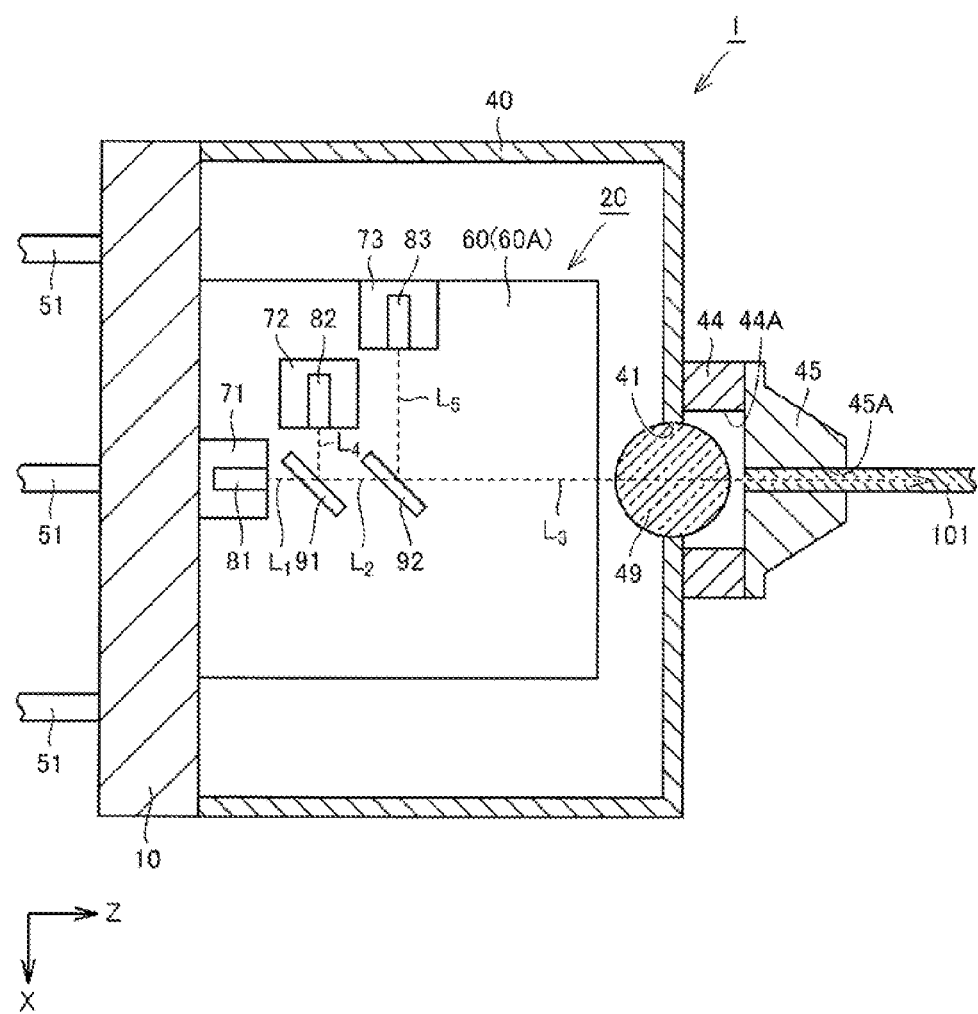
FIG. 5 is a schematic sectional view illustrating the structure of an optical module according to Embodiment 3.

Hereinafter, still another embodiment, Embodiment 3 will be described. FIG. 5 is a schematic sectional view illustrating the structure of an optical module according to Embodiment 3. FIG. 5 is a sectional view corresponding to FIG. 3 of Embodiment 1 described above. Referring to FIG. 5 and FIG. 3, an optical module 1 according to this embodiment basically has the same structure and provides the same advantages as in Embodiment 1. However, the optical module 1 according to Embodiment 3 is different from Embodiment 1 in that the optical module 1 further includes a base body 44 and a fiber support member 45, which are disposed on the cap 40 serving as a protective member and function as support members that support an optical fiber waveguide 101, which is an optical component that light outputted through the output window 41 enters.

Referring to FIG. 5, the base body 44 has the shape of a hollow cylinder. The base body 44 is attached, with one of its end surfaces, to the outer wall of the cap 40 such that a hollow portion 44A corresponds to the output window 41. The fiber support member 45 has the shape of a truncated cone having a through-hole 45A through which the central axis extends. The fiber support member 45 is attached, with its bottom surface, to an end surface of the base body 44, the end surface being opposite to the other end surface connected to the cap 40, such that the through-hole 45A corresponds to the hollow portion 44A of the base body 44. The optical fiber waveguide 101 is inserted into the through-hole 45A, so that the optical fiber waveguide 101 is supported by the fiber support member 45. A spherical lens 49 serving as a condensing lens is disposed at the output window 41. Thus, diverging light emitted from the first laser diode 81, the second laser diode 82, and the third laser diode 83 and coaxially multiplexed at the first filter 91 and the second filter 92, are condensed with the spherical lens 49 and enter the optical fiber waveguide 101. Such a structure is employed, so that a reduction in the size of the optical module 1 is achieved and light adjusted to have a desired color can be made to enter the optical fiber waveguide 101.

Embodiment 4

Figure 6:
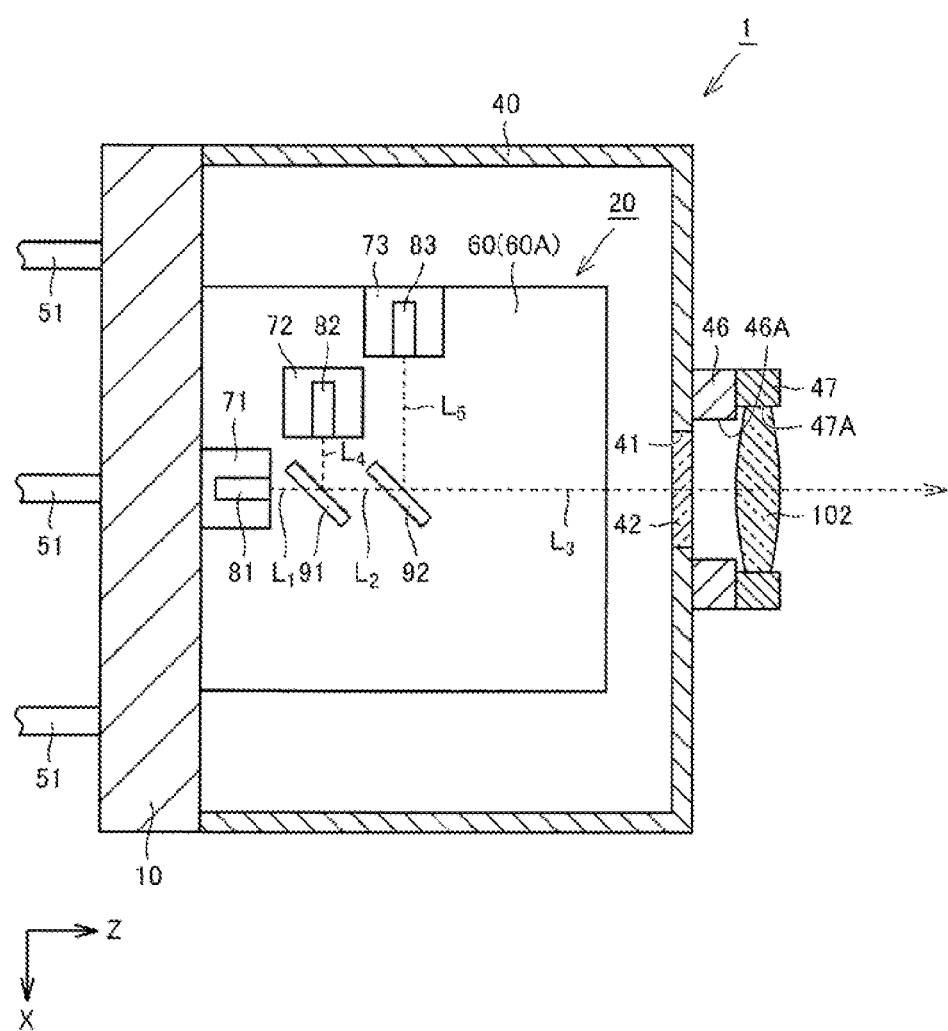
FIG. 6 is a schematic sectional view illustrating the structure of an optical module according to Embodiment 4.

Hereinafter, still another embodiment, Embodiment 4 will be described. FIG. 6 is a schematic sectional view illustrating the structure of an optical module according to Embodiment 4. FIG. 6 is a sectional view corresponding to FIG. 3 of Embodiment 1 described above. Referring to FIG. 6 and FIG. 3, an optical module 1 according to this embodiment basically has the same structure and provides the same advantages as in Embodiment 1. However, the optical module 1 according to Embodiment 4 is different from Embodiment 1 in that it further includes a base body 46 and a lens support member 47, which are disposed on the cap 40 serving as a protective member and function as support members that support an aspherical lens 102, which is an optical component that light outputted through the output window 41 enters.

Specifically, referring to FIG. 6, the base body 46 has the shape of a hollow cylinder. The base body 46 is attached, with one of its end surfaces, to the outer wall of the cap 40 such that a hollow portion 46A corresponds to the output window 41. The lens support member 47 has the shape of a hollow cylinder. The lens support member 47 is attached, with one of its end surfaces, to an end surface of the base body 46, the end surface being opposite to the other end surface connected to the cap 40, such that a hollow portion 47A corresponds to the hollow portion 46A of the base body 46. The aspherical lens 102 serving as a collimating lens is inserted into the hollow portion 47A, so that the outer circumferential surface of the aspherical lens 102 is supported by the lens support member 47. Thus, diverging light emitted from the first laser diode 81, the second laser diode 82, and the third laser diode 83 and coaxially multiplexed at the first filter 91 and the second filter 92, are converted by the aspherical lens 102 into collimated light. Such a structure is employed, so that a reduction in the size of the optical module 1 is achieved and collimated light adjusted to have a desired color can be obtained.

Incidentally, the submounts are formed of a material that has a thermal expansion coefficient similar to the thermal expansion coefficients of devices or the like mounted on the submounts. The submounts are formed of, for example, AlN (aluminium nitride), SiC (silicon carbide), Si (silicon), or diamond. The material for forming the stem and the cap may be, for example, a material having a high thermal conductivity such as iron or copper, or may be, for example, AN (aluminium nitride), CuW (copper tungsten), or CuMo (copper molybdenum).

When a lens is disposed at the output window 41 or outside of the output window 41, the first laser diode 81, the second laser diode 82, and the third laser diode 83 are preferably disposed such that light from the first laser diode 81, the second laser diode 82, and the third laser diode 83 has the same spot size or has focal points located at the same position. More specifically, in order to convert light from the first laser diode 81, the second laser diode 82, and the third laser diode 83 by the lens so as to have the same spot size, the first laser diode 81, the second laser diode 82, and the third laser diode 83 are preferably disposed such that the optical path length between the lens and the third laser diode 83, which emits light providing a higher refractive index (having a shorter wavelength), is larger than the optical path length between the lens and the second laser diode 82; and the optical path length between the lens and the first laser diode 81, which emits light providing a lower refractive index (having a longer wavelength), is smaller than the optical path length between the lens and the second laser diode 82.

The structures according to Embodiments 1 to 4 described above are examples of the structure of an optical module according to the present application. The above-described Embodiments relate to the cases of multiplexing light from three laser diodes. Alternatively, light from two laser diodes may be multiplexed, or light from four or more laser diodes may be multiplexed. The above-described Embodiments relate to the cases of employing laser diodes as examples of semiconductor light-emitting devices. Alternatively, the semiconductor light-emitting devices may be light-emitting diodes.

Embodiments disclosed herein are mere examples in all respects and should be understood as being non-limitative in any perspective. The scope of the present invention is defined not by the above-described description, but by Claims. The scope of the present invention is intended to embrace all the modifications within the meaning and range of equivalency of the Claims.

REFERENCE SIGNS LIST 1 optical module; 10 stem; 10A and 10B main surfaces; 20 light-forming part; 40 cap; 41 output window; 42 transmitting plate; 43 spherical lens; 44 base body; 44A hollow portion; 45 fiber support member; 45A through-hole; 46 base body; 46A hollow portion; 47 lens support member; 47A hollow portion; 49 spherical lens; 51 lead pin; 60 base block; 60A mount surface; 71 first submount; 72 second submount; 73 third submount; 81 first laser diode; 82 second laser diode; 83 third laser diode; 91 first filter; 92 second filter; 101 optical fiber waveguide; 102 aspherical lens

The invention claimed is:

1. An optical module comprising:
a light-forming part configured to form light; and
a protective member that includes an output window configured to transmit light from the light-forming part and that is disposed so as to surround the light-forming part,
wherein the light-forming part includes
a base member,
a plurality of semiconductor light-emitting devices including a first semiconductor light-emitting device mounted on the base member and configured to emit light at a first wavelength a second semiconductor light-emitting device mounted on the base member and configured to emit light at a second wavelength shorter than the first wavelength, and a third semiconductor light-emitting device mounted on the base member and configured to emit light at a third wavelength shorter than the second wavelength,
a first filter mounted on the base member and configured to directly receive and coaxially multiplex diverging light from the first semiconductor light-emitting device and the second semiconductor light-emitting device,
a second filter mounted on the base member and configured to receive and coaxially multiplex diverging light from the first semiconductor light-emitting device, the second semiconductor light-emitting device, and the third semiconductor light-emitting device,
a lens disposed at the output window and configured to convert, in terms of spot size, coaxially multiplexed diverging light from the first semiconductor light-emitting device, the second semiconductor light-emitting device, and the third semiconductor light-emitting device,
an optical path length between the lens and the first semiconductor light-emitting device that is smaller than an optical path length between the lens and the second semiconductor light-emitting device, and
the optical path length between the lens and the second semiconductor light-emitting device is smaller than an optical path length between the lens and the third semiconductor light-emitting device.

2. The optical module according to claim 1, wherein the diverging light emitted from the first semiconductor light-emitting device and the second semiconductor light-emitting device are, without passing through any lens, transmitted by the filter or reflected by the filter.

3. The optical module according to claim 1, wherein the lens disposed at the output window is a spherical lens.

4. The optical module according to claim 1, further comprising a support member disposed on the protective member configured to support an optical component that light outputted through the output window enters.

5. The optical module according to claim 4, further comprising the optical component supported by the support member.

6. The optical module according to claim 5, wherein the optical component is an optical fiber waveguide.

7. The optical module according to claim 5, wherein the optical component is a lens.

8. The optical module according to claim 1, wherein the first semiconductor light-emitting device is configured to emit red light, the second semiconductor light-emitting device is configured to emit green light, and the third semiconductor light-emitting device is configured to emit blue light.

9. The optical module according to claim 1, wherein the semiconductor light-emitting devices are laser diodes.

10. An optical module comprising:
a light-forming part configured to form light; and
a protective member that includes an output window configured to transmit light from the light-forming part and that is disposed so as to surround the light-forming part,
wherein the light-forming part includes
a base member,
a plurality of semiconductor light-emitting devices including
a first semiconductor light-emitting device mounted on the base member and configured to emit light at a first wavelength, a second semiconductor light-emitting device mounted on the base member and configured to emit light at a second wavelength shorter than the first wavelength, a third semiconductor light-emitting device mounted on the base member and configured to emit light at a third wavelength shorter than the second wavelength, a first filter mounted on the base member and configured to directly receive and coaxially multiplex diverging light from the first semiconductor light-emitting device and the second semiconductor light-emitting device, a second filter mounted on the base member and configured to receive and coaxially multiplex diverging light from the first semiconductor light-emitting device, the second semiconductor light-emitting device, and the third semiconductor light-emitting device, a support member disposed on the protective member, a lens supported by the support member and configured to enter light outputted through the output window, an optical path length between the lens and the first semiconductor light-emitting device that is smaller than an optical path length between the lens and the second semiconductor light-emitting device, and the optical path length between the lens and the second semiconductor light-emitting device is smaller than an optical path length between the lens and the third semiconductor light-emitting device.

11. The optical module according to claim 10, wherein the diverging light emitted from the first semiconductor light-emitting device and the second semiconductor light-emitting device are, without passing through any lens, transmitted by the filter or reflected by the filter.

12. The optical module according to claim 10, wherein the first semiconductor light-emitting device is configured to emit red light, the second semiconductor light-emitting device is configured to emit green light, and the third semiconductor light-emitting device is configured to emit blue light.

13. The optical module according to claim 10, wherein the semiconductor light-emitting devices are laser diodes.

14. An optical module comprising:
a light-forming part configured to form light; and
a protective member that includes an output window configured to transmit light from the light-forming part and that is disposed so as to surround the light-forming part,
wherein the light-forming part includes
a base member,
a plurality of semiconductor light-emitting devices including a first semiconductor light-emitting device mounted on the base member and configured to emit light at a first wavelength, a second semiconductor light-emitting device mounted on the base member and configured to emit light at a second wavelength shorter than the first wavelength, and a third semiconductor light-emitting device mounted on the base member and configured to emit light at a third wavelength shorter than the second wavelength, a first filter mounted on the base member and configured to directly receive and coaxially multiplex diverging light from the first semiconductor light-emitting device and the second semiconductor light-emitting device, a second filter mounted on the base member and configured to receive and coaxially multiplex diverging light from the first semiconductor light-emitting device, the second semiconductor light-emitting device, and the third semiconductor light-emitting device, a base body attached to the protective member having a shape of a hollow cylinder corresponds to the output window, a support member connected to the base body having a shape of a hollow cylinder including an inner diameter larger than an inner diameter of the base body, a lens disposed at the output window and configured to convert, in terms of spot size, coaxially multiplexed diverging light from the first semiconductor light-emitting device, the second semiconductor light-emitting device, and the third semiconductor light-emitting device, an optical path length between the lens and the first semiconductor light-emitting device that is smaller than an optical path length between the lens and the second semiconductor light-emitting device, and the optical path length between the lens and the second semiconductor light-emitting device is smaller than an optical path length between the lens and the third semiconductor light-emitting device.

15. The optical module according to claim 14, wherein the diverging light emitted from the semiconductor light-emitting devices are, without passing through any lens, transmitted by the filter or reflected by the filter.

16. The optical module according to claim 14, wherein the lens disposed at the output window is a spherical lens.

17. The optical module according to claim 14, wherein the first semiconductor light-emitting device is configured to emit red light, the second semiconductor light-emitting device is configured to emit green light, and the third semiconductor light-emitting device is configured to emit blue light.

* * * * *

UNITED STATES PATENT AND TRADEMARK OFFICE
CERTIFICATE OF CORRECTION

PATENT NO. : 10,644,480 B2
APPLICATION NO. : 16/094016
DATED : May 5, 2020
INVENTOR(S) : Hiromi Nakanishi It is certified that error appears in the above-identified patent and that said Letters Patent is hereby corrected as shown below:

In the Claims

In Claim 1, Column 9, Line 63, "at a first wavelength a second semiconductor" should read --at a first wavelength, a second semiconductor--.

Signed and Sealed this
Twentieth Day of October, 2020

Andrei Iancu
*Director of the United States Patent and Trademark Office*